United States Patent
Genevey et al.

(10) Patent No.: US 12,169,221 B2
(45) Date of Patent: Dec. 17, 2024

(54) ADAPTIVE BODY BIASING OR VOLTAGE REGULATION USING SLACK SENSORS

(71) Applicant: Dolphin Design, Meylan (FR)

(72) Inventors: Sebastien Genevey, Gieres (FR);
Mathieu Louvat, Grenoble (FR);
Lionel Jure, Domene (FR)

(73) Assignee: Dolphin Design, Meylan (FR)

( * ) Notice: Subject to any disclaimer, the term of this patent is extended or adjusted under 35 U.S.C. 154(b) by 453 days.

(21) Appl. No.: 17/468,982

(22) Filed: Sep. 8, 2021

(65) Prior Publication Data
US 2022/0082615 A1 Mar. 17, 2022

(30) Foreign Application Priority Data

Sep. 11, 2020 (FR) .................... 20/09234

(51) Int. Cl.
*G06F 1/08* (2006.01)
*G01R 31/30* (2006.01)
(Continued)

(52) U.S. Cl.
CPC ... *G01R 31/3016* (2013.01); *G01R 31/31725* (2013.01); *G06F 1/08* (2013.01);
(Continued)

(58) Field of Classification Search
CPC ............ G06F 21/73; G06F 21/79; G06F 1/08; G06F 3/0383; G06F 3/04897; G06F 1/206; G06F 1/28; G06F 1/30; G06F 15/7842; G06F 15/7867; G06F 1/3203; G06F 1/3237; G06F 1/3287; G06F 30/398; G06F 13/16; G06F 1/24; G06F 11/3013; G06F 11/3423; G06F 21/71; G06F 2111/08; G06F 2119/06; G06F 2119/08; G06F 2119/10; G06F 2119/12; G06F 2119/18; G06F 30/20; G06F 30/30; G06F 30/3308; G06F 30/3312; G06F 30/337; G06F 30/39;
(Continued)

(56) References Cited

U.S. PATENT DOCUMENTS 6,377,103 B1 4/2002 Mooney et al.
2005/0251700 A1 11/2005 Henderson et al.
(Continued)

FOREIGN PATENT DOCUMENTS

EP 3179260 A1 6/2017

*Primary Examiner* — Binh C Tat
(74) *Attorney, Agent, or Firm* — Noblitt & Newson, PLLC

(57) ABSTRACT

The present disclosure relates to an adaptive body biasing or voltage regulation circuit for a circuit region, comprising: a first delay module configured to delay a local clock signal to generate first and second output signals delayed by first and second delays; a multiplexer configured to select one of the first and second output signals; a first slack monitor circuit configured to generate a first detection signal indicating when a slack time of the first and second output signals is less than a first threshold; a voltage generation circuit configured to generate a supply voltage for the circuit region, or at least one biasing voltage for biasing wells of transistors in the circuit region, using a further control loop comprising a process, voltage and/or temperature sensor; and a control circuit configured to adjust a gain of the further control loop based on the first detection signal.

22 Claims, 10 Drawing Sheets

(51) Int. Cl.
*G01R 31/317* (2006.01)
*G06F 1/3203* (2019.01)
*H03K 3/011* (2006.01)
*H03K 5/134* (2014.01)
*H03K 5/00* (2006.01)

(52) U.S. Cl.
CPC ........... *G06F 1/3203* (2013.01); *H03K 3/011* (2013.01); *H03K 5/134* (2014.07); *H03K 2005/00013* (2013.01)

(58) Field of Classification Search
CPC .......... G06F 1/10; G06F 1/324; G06F 1/3296; G03F 9/7049; G03F 9/7088; H01L 2924/00014; H01L 2224/73204; G01R 31/31725; G01R 31/2856; G01R 31/2884; G01R 31/31712; G01R 31/31718; G01R 31/3016; G01R 31/382; G01R 31/3835

USPC .................................................. 716/106–115
See application file for complete search history.

(56) References Cited

U.S. PATENT DOCUMENTS

| | | |
|---|---|---|
| 2007/0096775 A1 | 5/2007 | Elgebaly et al. |
| 2009/0085685 A1* | 4/2009 | Guo .......................... H03L 1/02 331/185 |
| 2010/0182055 A1 | 7/2010 | Rozen et al. |
| 2012/0216067 A1 | 8/2012 | Whatmough et al. |
| 2016/0098062 A1* | 4/2016 | Sharma .................. H03K 5/159 327/295 |
| 2017/0005574 A1* | 1/2017 | Wyland .................. H02M 3/158 |
| 2017/0299651 A1 | 10/2017 | Clerc |
| 2020/0150180 A1* | 5/2020 | Höppner .......... G01R 31/31718 |

\* cited by examiner

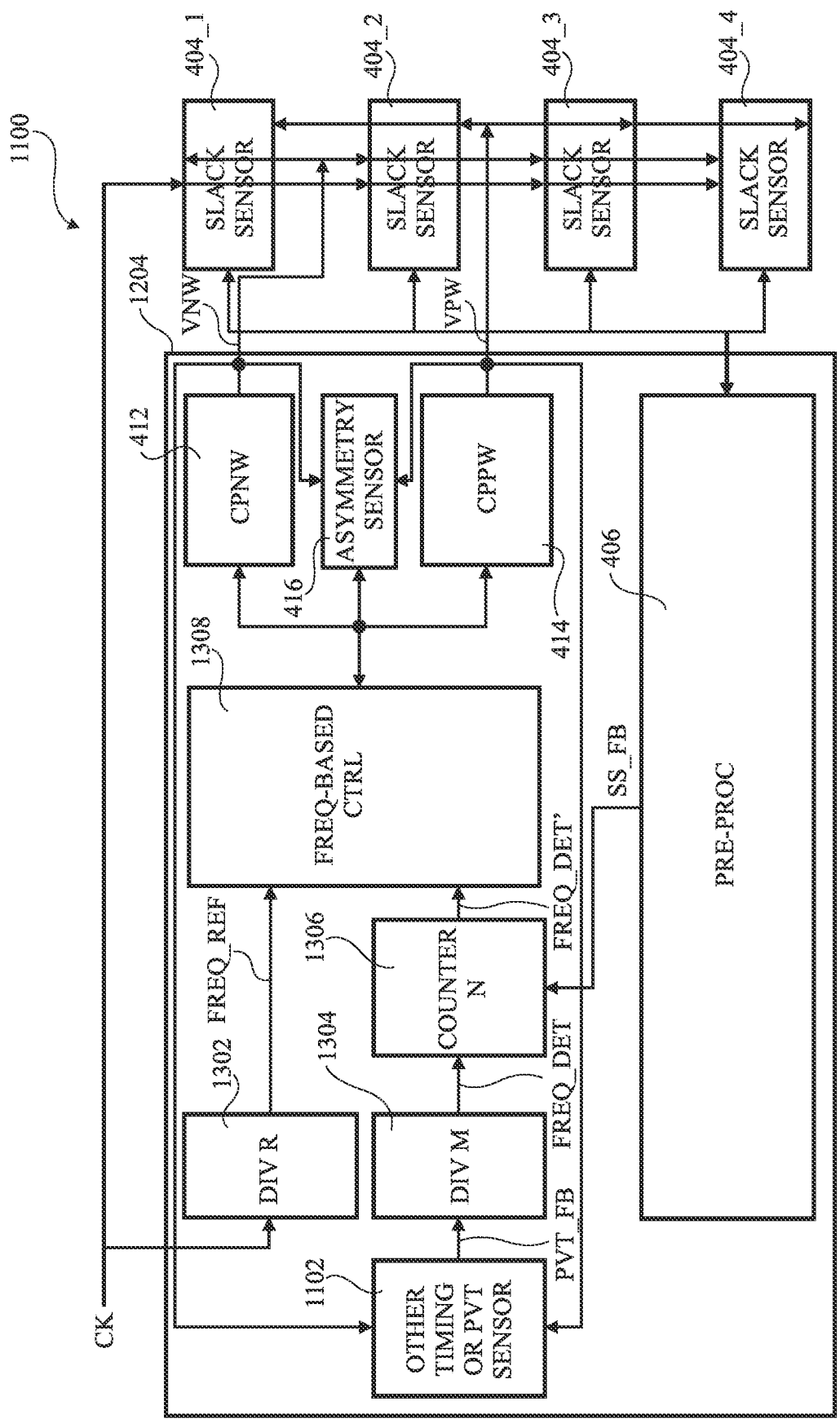

ADAPTIVE BODY BIASING OR VOLTAGE REGULATION USING SLACK SENSORS

The present patent application claims priority from the French patent application FR2009234 filed on 11 Sep. 2020, the contents of which is hereby incorporated by reference.

TECHNICAL FIELD

The present disclosure relates generally to the field of integrated circuits, and in particular to adaptive body biasing (ABB) or voltage regulation based on a measurement of slack.

BACKGROUND ART

It has been proposed to alter the body biasing voltages of transistors of integrated circuits in order to increase performance and/or reduce power consumption. A shift towards SOI (silicon on insulator) based transistor technology makes body biasing a particularly interesting proposition as this technology permits a relatively broad range of biasing voltages, for example from as low as −3 V to as high as +3 V, to be applied to the body of the devices. This compares to a more limited body biasing range of −300 mV to +300 mV in the case of bulk transistors. The biasing voltage is applied to the p-type or n-type well underlying each SOI transistor device, sometimes referred to as the back gate.

Forward body biasing (FBB) involves applying a body biasing voltage to decrease the transistor threshold voltage and thus increase performance by increasing the speed of the transistors.

Reverse body biasing (RBB) involves applying a body biasing voltage that increases the transistor threshold voltage and thus reduces leakage current and thus the power consumption.

It has also been proposed to improve circuit performance and/or reduce energy consumption by modifying clock frequencies and/or power supply voltages supplied to areas of integrated circuits. For example, this allows a reduction or cancellation of performance/power variations related to temperature, power supply voltage or technological process changes.

It would be desirable to provide a system for the adaptive control of the supply voltage and/or of the body biasing voltages of certain transistors of an integrated circuit for a better control of performance and power. However, there are difficulties in implementing such a system for cases in which the clock frequency and/or the power supply voltage may also be modified dynamically.

SUMMARY OF INVENTION

According to one aspect, there is provided an adaptive body biasing circuit for a circuit region, comprising: a first delay module having a plurality of delay circuits configured to delay at least one edge of a local clock signal of the circuit region, a first of the delay circuits providing a first output signal delayed by a first delay with respect to the local clock signal, and a second of the delay circuits providing a second output signal delayed by a second delay with respect to the local clock signal; a multiplexer configured to select one of the first and second output signals; a first slack monitor circuit configured to generate a first detection signal indicating when a slack time of the selected one of the first and second output signals is less than a first threshold; and a biasing circuit configured to generate at least one biasing voltage for biasing wells of transistors in the circuit region based on the first detection signal.

According to a further aspect, there is provided an adaptive body biasing or voltage regulation circuit for a circuit region, comprising: a first delay module having a plurality of delay circuits configured to delay at least one edge of a local clock signal of the circuit region, a first of the delay circuits providing a first output signal delayed by a first delay with respect to the local clock signal, and a second of the delay circuits providing a second output signal delayed by a second delay with respect to the local clock signal; a multiplexer configured to select one of the first and second output signals; a first slack monitor circuit configured to generate a first detection signal indicating when a slack time of the selected one of the first and second output signals is less than a first threshold; a voltage generation circuit configured to generate at least one supply voltage for the circuit region, or at least one biasing voltage for biasing wells of transistors in the circuit region, using a further control loop comprising a process, voltage (biasing and/or supply voltage) and/or temperature sensor; and a control circuit configured to adjust a gain of the further control loop based on the first detection signal.

According to one embodiment, the process, voltage and/or temperature sensor is configured to generate an oscillating output signal having a frequency that varies as a function of process, voltage (biasing and/or supply voltage) and/or temperature variations, and wherein the control circuit is configured to adjust the gain by modifying a division value of a frequency divider configured to divide the frequency of the oscillating output signal in order to generate a modified oscillating output signal.

According to one embodiment, the frequency divider is a counter, and the division value is set by a count limit of the counter.

According to one embodiment, the voltage generate circuit further comprises a frequency-based control circuit configured to compare the frequency of the modified oscillating output signal with the frequency of a reference clock signal, and to generate the at least one supply voltage for the circuit region, or the at least one biasing voltage, based on the comparison.

According to one embodiment, the first slack monitor, or a second slack monitor, is configured to generate a second detection signal indicating when a slack time of the selected one of the first and second output signals is greater than a further threshold, wherein the biasing circuit is configured to generate the at least one biasing voltage based on the first and second detection signals.

According to one embodiment, the plurality of delay circuits are coupled in series with each other to delay the propagation of at least one edge of the local clock signal.

According to one embodiment, each delay circuit comprises one or more logic elements formed of transistors having wells biased by the at least one biasing voltage.

According to one embodiment, the biasing circuit is configured to generate a first biasing voltage for biasing n-type wells of transistors of a first conduction type in the circuit region, and a second biasing voltage for biasing p-type wells of transistors of a second conduction type in the circuit region.

According to one embodiment, the circuit further comprising a first voltage generator configured to generate the first biasing voltage and a second voltage generator configured to generate the second biasing voltage.

According to one embodiment, the first and/or second voltage generators are charge pumps.

According to one embodiment, the circuit further comprising an asymmetry sensor configured to detect when the first and second biasing voltages result in asymmetry between the n-well and p-well biasing, wherein the biasing circuit is configured to generate the at least one biasing voltage based on the asymmetry detection.

According to one embodiment, the delay circuits of the first delay module each comprise one or more logic elements formed of transistors of a first structural type having threshold voltages falling in a first range, the adaptive body biasing circuit further comprising: a second delay module having a plurality of delay circuits configured to delay the at least one edge of the local clock signal of the circuit region, wherein the delay circuits of the second delay module each comprise one or more logic elements of a different type to those forming the first delay module, the one or more logic elements of the second delay module being formed of transistors of the first structural type.

According to one embodiment, the circuit further comprises: a third delay module having a plurality of delay circuits configured to delay the at least one edge of the local clock signal of the circuit region, wherein the delay circuits of the third delay module each comprise one or more logic elements formed of transistors of a second structural type having threshold voltages falling in a second range.

According to one embodiment, the first slack monitor is implemented by transistors of the first structural type, and the circuit further comprises a second slack monitor circuit implemented by transistors of the second structural type.

According to one embodiment, the circuit further comprises a system control circuit configured to generate a selection signal for performing the selection of one of the first and second detection signals.

According to one embodiment, the circuit further comprises a further control loop comprising a timing, process, voltage and/or temperature sensor, the biasing circuit being configured to generate the at least one biasing voltage further based on the further control loop.

According to a further aspect, there is provided an integrated circuit comprising: a first circuit region receiving a first local clock signal; a second circuit region receiving a second local clock signal; and the above adaptive body biasing circuit, wherein the plurality of delay circuits of the first delay module are configured to delay at least one edge of the first local clock signal, or of a clock signal generated based on the first local clock signal, the adaptive body biasing circuit further comprising a further delay module comprising a further plurality of delay circuits configured to delay at least one edge of the second local clock signal, or of a clock signal generated based on the second local clock signal, to generate one or more further output signals, and a further slack monitor circuit configured to generate a further detection signal indicating when a slack time of a selected one of the further output signals is less than a first threshold.

According to a further aspect, there is provided a method of adaptive body biasing of transistors in a circuit region of an integrated circuit, the method comprising: delaying, by a first delay module having a plurality of delay circuits, at least one edge of a local clock signal of the circuit region, wherein a first of the delay circuits provides a first output signal delayed by a first delay with respect to the local clock signal, and a second of the delay circuits provides a second output signal delayed by a second delay with respect to the local clock signal; selecting one of the first and second output signals; generating, by a first slack monitor, a first detection signal indicating when a slack time of the selected one of the first and second output clock signals is less than a first threshold; and generating, by a biasing circuit, at least one biasing voltage for biasing wells of transistors in the circuit region based on the first detection signal.

According to a further aspect, there is provided a method of adaptive body biasing of transistors in a circuit region of an integrated circuit, the method comprising: delaying, by a first delay module having a plurality of delay circuits, at least one edge of a local clock signal of the circuit region, wherein a first of the delay circuits provides a first output signal delayed by a first delay with respect to the local clock signal, and a second of the delay circuits provides a second output signal delayed by a second delay with respect to the local clock signal; selecting one of the first and second output signals; generating, by a first slack monitor, a first detection signal indicating when a slack time of the selected one of the first and second output clock signals is less than a first threshold; and generating, by a voltage generation circuit, at least one supply voltage for the circuit region, or at least one biasing voltage for biasing wells of transistors in the circuit region, based on the first detection signal using a further control loop comprising a process, voltage and/or temperature sensor, wherein a gain of the further control loop is adjusted based on the first detection signal.

BRIEF DESCRIPTION OF DRAWINGS

The foregoing features and advantages, as well as others, will be described in detail in the following description of specific embodiments given by way of illustration and not limitation with reference to the accompanying drawings, in which:

FIG. 13 schematically illustrates the circuit of FIG. 11 in yet more detail according to an example embodiment of the present disclosure;

DESCRIPTION OF EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Furthermore, the following terms are given the following definitions:

body biasing voltage—a voltage applied to n-wells or p-wells of CMOS bulk transistors or SOI (silicon on insulator) transistors (also known as a fully depleted SOI (FDSOI) transistors) thereby causing a modification to the gate threshold voltage Vth of the transistors;

forward body biasing (FBB)—the application of body biasing voltages to PMOS and/or NMOS transistors in order to lower their threshold voltage Vth and increase performance by increasing their speed; and reverse body biasing (RBB)—the application of body biasing voltages to PMOS and/or NMOS transistors in order to increase their threshold voltage Vth and reduce power consumption by reducing current leakage.

Figure 1:
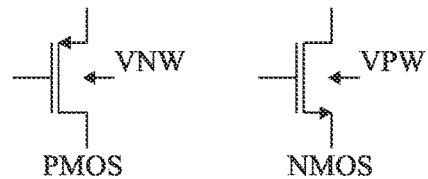
FIG. 1 schematically illustrates a p-channel MOS (PMOS) transistor and an n-channel MOS (NMOS) transistor receiving body biasing voltages.

FIG. 1 schematically illustrates a PMOS transistor and an NMOS transistor, which are for example formed in conventional wells, the PMOS transistor for example being formed in an n-type well (NWELL), which is coupled to a body biasing voltage VNW, and the NMOS transistor for example being formed in a p-type well (PWELL), which is coupled to a body biasing voltage VPW.

In the case of a flip well configuration (not illustrated in FIG. 1), the NMOS transistor is formed in an NWELL coupled to the body biasing voltage VNW, and the PMOS transistor is formed in a PWELL coupled to the body biasing voltage VPW.

Figure 2:
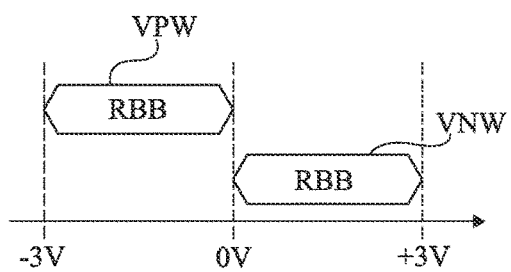
FIG. 2 is a graph representing an example of body biasing voltage ranges for PMOS and NMOS transistors in conventional wells (n-channel transistor in p-type well and p-channel transistor in n-type well)

FIG. 2 is a graph representing example ranges of the body biasing voltages VPW and VNW applied respectively to p-wells and n-wells of conventional PMOS and NMOS transistors, like those of FIG. 1. Both of the body biasing voltages VPW and VNW are for example at 0 V in the case that no body biasing voltage is applied. The body biasing voltage VPW is for example a negative voltage of between 0 V and −3 V in the case of a reverse body biasing voltage RBB. The body biasing voltage VNW is for example a positive voltage of between 0 V and +3 V in the case of a reverse body biasing voltage RBB.

In the case of a flip well configuration (not illustrated in FIG. 2), the body biasing voltage VPW is for example a negative voltage of between 0 V and −3 V in the case of a forward body biasing voltage FBB, and the body biasing voltage VNW is for example a positive voltage of between 0 V and +3 V in the case of a forward body biasing voltage FBB.

Thus, in the case of a circuit comprising conventional and/or flip well configurations, the body biasing voltage VPW should always be negative, and the body biasing voltage VNW should always be positive.

Figure 3:
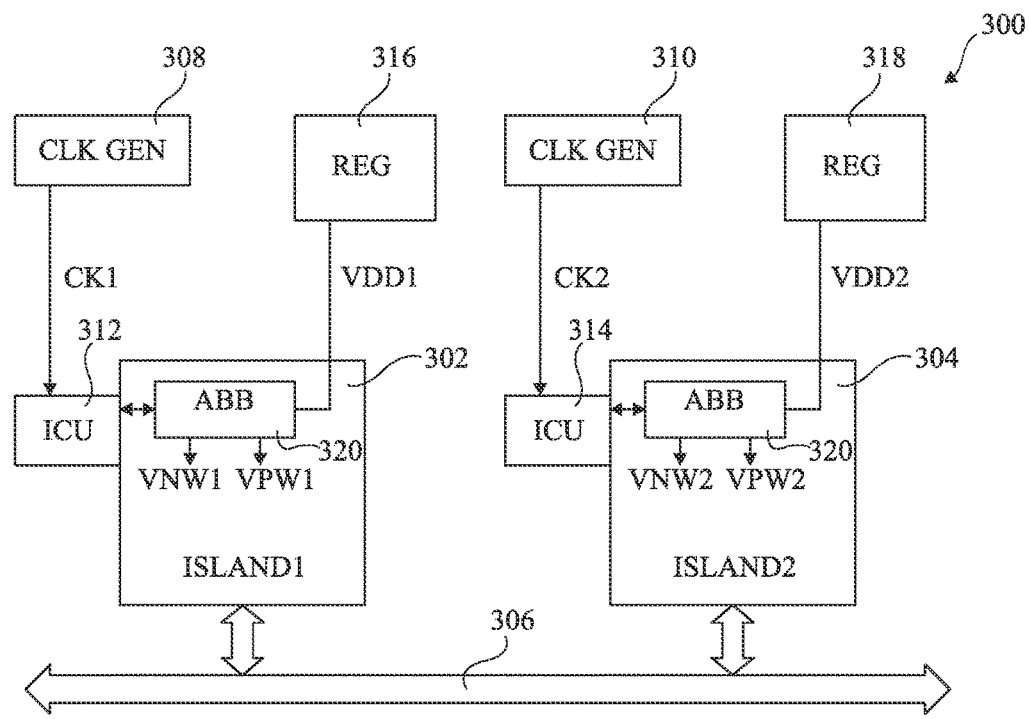
FIG. 3 schematically illustrates an integrated circuit comprising islands according to an example embodiment of the present disclosure.

FIG. 3 schematically illustrates a circuit 300 of an integrated circuit comprising islands according to an example embodiment of the present disclosure. For example, a circuit comprising islands is also described in more detail in the US patent application US2007/0132021, the contents of which are hereby incorporated by reference to the extent permitted by the law.

The example of FIG. 3 comprises two islands (ISLAND1, ISLAND2) 302, 304. In some embodiments, the islands 302, 304 are each coupled to a bus 306 permitting communications between the islands and/or with other circuits not illustrated in FIG. 3.

Each island 302, 304 corresponds to one or more circuits sharing a common clock signal and supply voltage. For example, the circuit 300 comprises two clock generators (CLK GEN) 308, 310 each capable of independently generating a clock signal of a desired frequency. The island 302 receives, from the clock generator 308, a clock signal CK1, which is for example provided to the island 302 via an island control unit (ICU) 312 associated with the island 302. Similarly, the island 304 receives, from the clock generator 310, a clock signal CK2, which is for example provided to the island 304 via an island control unit (ICU) 314 associated with the island 304. The island 302 is for example powered by a supply voltage VDD1 provided by a voltage regulator (REG) 316, and the island 304 is for example powered by a supply voltage VDD2 provided by a voltage regulator (REG) 318.

Each island 302, 304 for example comprises an adaptive body biasing circuit (ABB) 320, which for example receives the clock signal supplied to the island, and adaptively generates body biasing voltages for applying to transistor n-wells and p-wells of the island. For example, the circuit 320 of the island 302 generates signals VNW1, VPW1 for applying to the transistors of the island 302 using the supply voltage VDD1, and the circuit 320 of the island 304 generates signals VNW2, VPW2 for applying to the transistors of the island 304 using the supply voltage VDD2. The body biasing voltages may correspond to voltages for forward body biasing (FBB) and/or reverse body biasing (RBB).

Figure 4:
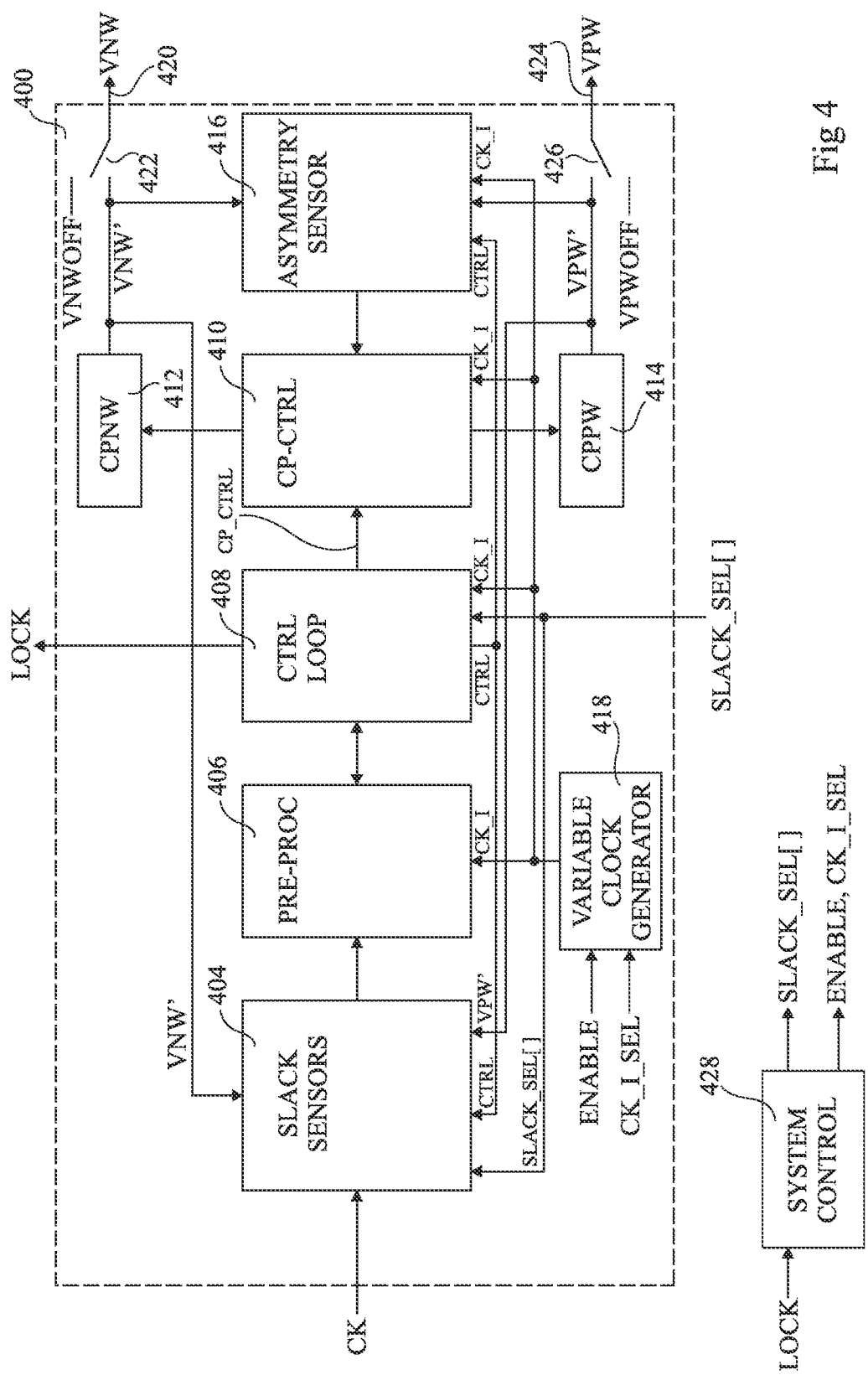
FIG. 4 schematically illustrates a circuit for adaptive body biasing according to an example embodiment of the present disclosure.

FIG. 4 schematically illustrates a circuit 400 for adaptive body biasing according to an example embodiment of the present disclosure. For example, the circuit 400 is used to implement each of the adaptive body biasing circuits 320 of the islands 302, 304 of FIG. 3.

The circuit 400 for example comprises slack sensors (SLACK SENSORS) 404 receiving a local clock signal CK, which is for example the clock signal CK1 in the case of island 302 of FIG. 3, or the clock signal CK2 in the case of island 304 of FIG. 3. The circuit 400 for example further comprises a pre-processing circuit (PRE-PROC) 406, a control loop (CTRL LOOP) 408, a charge pump control circuit (CP-CTRL) 410, an n-well charge pump (CPNW) 412, a p-well charge pump (CPPW) 414, an asymmetry sensor (ASYMMETRY SENSOR) 416 and a variable clock generator (VARIABLE CLOCK GENERATOR) 418.

The slack sensors 404 are for example configured to detect when a slack time falls below one or more thresholds, while considering a plurality of different propagation delays of the clock signal CK, as will be described in more detail below.

The pre-processing circuit 406 for example permits detection signals from the slack sensors 404 to be combined.

The control loop 408 receives one or more signals from the slack sensors. In some embodiments, the control loop 408 receives a combined detection signal from the slack sensors, and implements a control loop by generating and providing one or more control signals CP_CTRL to the charge pump control circuit 410 based on the combined detection signal. The control loop 408 also for example generates a signal LOCK indicating that a steady state has been reached.

The charge pump control circuit 410 for example controls the n-well charge pump 412 and the p-well charge pump 414 based on the control signals (CP_CTRL) provided by the control loop 408 and also based on control signals provided by the asymmetry sensor 416.

The n-well charge pump 412 is coupled to an n-well biasing rail 420 and generates a biasing voltage VNW for biasing, via the rail 420, n-type wells of transistors in the island. In some embodiments, a switch 422 is provided between the output VNW' of the n-well charge pump 412 and the n-well biasing rail 420 permitting the n-well biasing to be applied by an external voltage via an input VNWOFF of the switch 422. This permits in particular a default biasing voltage to be applied while the circuit 400 is no longer operating.

Similarly, the p-well charge pump 414 is coupled to a p-well biasing rail 424 and generates a biasing voltage VPW for biasing, via the rail 424, p-type wells of transistors in the island. In some embodiments, a switch 426 is provided between the output VPW' of the p-well charge pump 414 and the p-well biasing rail 424 permitting the p-well biasing to be applied by an external voltage via an input VPWOFF of the switch 426. This permits in particular a default biasing voltage to be applied while the circuit 400 is no longer operating.

The biasing voltages VNW, VPW at the output of the adaptive biasing circuit 400, or the voltages VNW', VPW' at the outputs of the charge pumps 412, 414 respectively, are for example provided to the slack sensors 404, and are for example used to bias transistors forming logic elements of delay circuits of the slack sensors 404, as will be described in more detail below.

The asymmetry sensor 416 for example measures when there is asymmetry between the voltage levels VNW and VPW and compares this asymmetry to a target asymmetry condition. For example, as will be described below in more detail with reference to FIG. 14, the asymmetry sensor 416 comprises one ring oscillator formed of PMOS transistors, and another ring oscillator formed of NMOS transistors, and a phase frequency detector for detecting which of the signals generated by these two ring oscillators has the highest frequency. However, other implementations of the asymmetry sensor would be possible for detecting asymmetry between the operating speeds of the p-channel and n-channel devices, or between characteristics of the transistors, impacting their respective operating speeds. Based on the difference between the measured and target asymmetry, control signals are for example provided to the charge pump control circuit 410 to adapt the voltage VPW. In some embodiments, the target asymmetry can be as low as 0 to ensure strong symmetry between the voltages VPW and VNW. In other embodiments, some asymmetry between the voltages VPW and VNW may be desirable.

The variable clock generator 418 for example receives an enable signal (ENABLE) and an internal clock selection signal CK_I_SEL, and generates an internal clock signal CK_I for controlling timing of the pre-processing circuit 406, the control loop 408, the charge pump control circuit 410 and the asymmetry sensor 416.

A system control circuit (SYSTEM CONTROL) 428 for example generates a control signal SLACK_SEL[ ] provided to the slack sensors 404 and to the control loop 408. The system control circuit 428 for example receives the lock signal LOCK generated by the control loop 408, and may additionally receive other inputs (not shown), and also for example generates the enable signal ENABLE and the internal clock selection signal CK_I_SEL.

Figure 5:
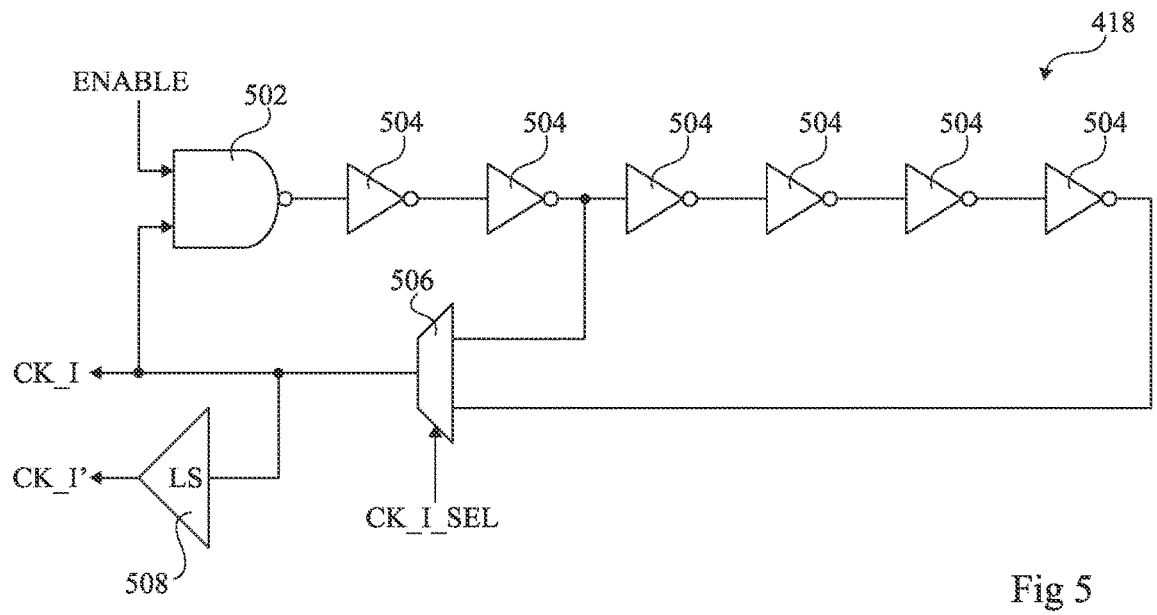
FIG. 5 schematically illustrates a variable clock generator of the circuit of FIG. 4 in more detail according to an example embodiment.

FIG. 5 schematically illustrates the variable clock generator 418 of FIG. 4 in more detail according to an example embodiment.

The generator 418 is for example activated by the signal ENABLE. For example, the generator 418 comprises a NAND gate 502 receiving at one of its inputs the signal ENABLE, and at its other input the internal clock signal CK_I generated by the generator 418. The output of the NAND gate 502 is for example coupled to a chain of inverters 504, there being six inverters 504 in the chain in the example of FIG. 5. An output of the final inverter of the chain is coupled to one input of a multiplexer 506. Another input of the multiplexer 506 is coupled to an intermediate node in the inverter chain, which in the example of FIG. 5 is the node at the output of the second inverter 504 of the chain. An output of the multiplexer 506 provides the internal clock signal CK_I. In some embodiments, a further version CK_I' of the internal clock signal is provided by a level shifter (LS) 508 coupled to the output of the multiplexer 506. For example, while not illustrated in FIG. 4, the charge pump control circuit 410 receives the clock signal CK_I' having high level pulses at a higher voltage than the signal CK_I.

While FIG. 5 illustrates an example in which the variable clock generator 418 is capable of generating a clock having one of two different frequencies, it will be apparent to those skilled in the art that more than two frequencies could be provided by adding inverters and additional taps coupled to further inputs of the multiplexer 506. Furthermore, another type of ring oscillator could be used, such as one based on starved inverters.

Figure 6:
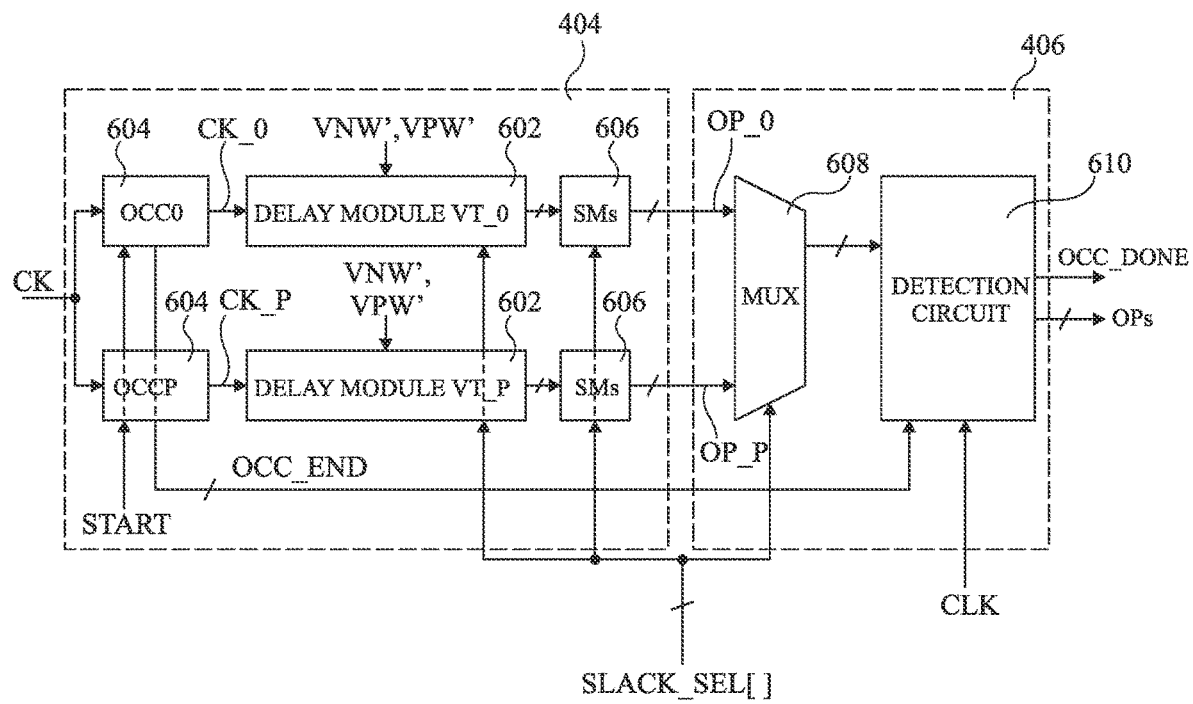
FIG. 6 schematically illustrates slack sensors and a pre-processing circuit of the circuit of FIG. 4 in more detail according to an example embodiment.

FIG. 6 schematically illustrates the slack sensors 404 and pre-processing circuit 406 of the circuit 400 of FIG. 4 in more detail according to an example embodiment.

The slack sensors 404 for example comprise one or more delay modules 602. In the example of FIG. 6, there are P+1 delay modules (DELAY MODULE VT_0 to DELAY MODULE VT_P), each module being adapted for a different transistor structural type, and for example for transistors having different threshold voltage flavors VT_0 to VT_P. As will be described in more detail below, each delay module 602 comprises logic elements implemented by transistors of the corresponding structural type, and having an n-well driven by the biasing voltage VNW', or a p-well driven by the biasing voltage VPW'.

Each delay module 602 for example receives a corresponding clock signal CK_0 to CK_P, corresponding to the local clock signal CK of the island, propagated by a corresponding on-chip clock controller (OCC0, OCCP) 604. The on-chip clock controllers 604 are for example activated by a signal START, and for example propagate only a certain number of edges of the local clock signal CK to the delay modules 602 in order to avoid unnecessary consumption. For example, the on-chip clock controllers are configured to propagate two clock edges. Once the appropriate number of edges have been propagated by each OCC, it for example asserts a signal OCC_END.

Each delay module 602 for example comprises a plurality of delay cells in series, these delay cells providing outputs at different time delays with respect to the input clock signal CK_0 to CK_P, and these outputs from each delay module 602 are coupled to a corresponding set of slack monitors (SMs) 606. The sets of slack monitors 606 generate output signals OP_0 to OP_P respectively, which are for example provided to the pre-processing circuit 406, and in particular to corresponding inputs of a multiplexer/selector (MUX) 608. Outputs of the multiplexer/selector 608 are coupled to a detection circuit (DETECTION CIRCUIT) 610, which for example performs averaging and/or minimum and maximum detection and/or other processing to indicate for example to the control loop 408 of FIG. 4 which actions are to be performed to adjust the operation. This enables a finer measurement by using data from multiple instances of delay module/slack monitor pairs 602, 606, which are for example placed at different locations inside the island 302, 304. For example, these delay module/slack monitor pairs 602, 606 are configured to capture process gradients, i.e. local variations, and location-dependent variations of the operating conditions, namely temperature and voltage conditions.

The signal SLACK_SEL[ ] is for example provided to the delay modules 602, to the slack monitors 606 and to the multiplexer 608 for configuration purposes of the slack sensors 404. This selection signal for example enables a selection of one of the delay values in delay modules 602, a selection of one or more output signals of the monitors 606 and a selection of one or more of the inputs of the multiplexer 608.

While in the embodiment of FIG. 6 all of the chains of blocks 604, 602 and 606 are driven by a same clock signal CK, corresponding for example to the clock signal of an island, in alternative embodiments, different clock signals could be used to drive different chains of blocks 604, 602 and 606. For example, these different clock signals could correspond to clock signals of different islands, or to clock signals of different clock domains within a same island. As an example, the clock controller OCC0 and associated delay module 602 and slack monitors 606, could be driven by a first clock signal CK1 at a first frequency, and the clock controller OCCP and associated delay module 602 and slack monitors 606, could be driven by a second clock signal CK2 at a second frequency different to the first frequency. There is no limitation on the number of different clock signals and frequencies that could be used simultaneously among the slack sensors 404.

Figure 7A:
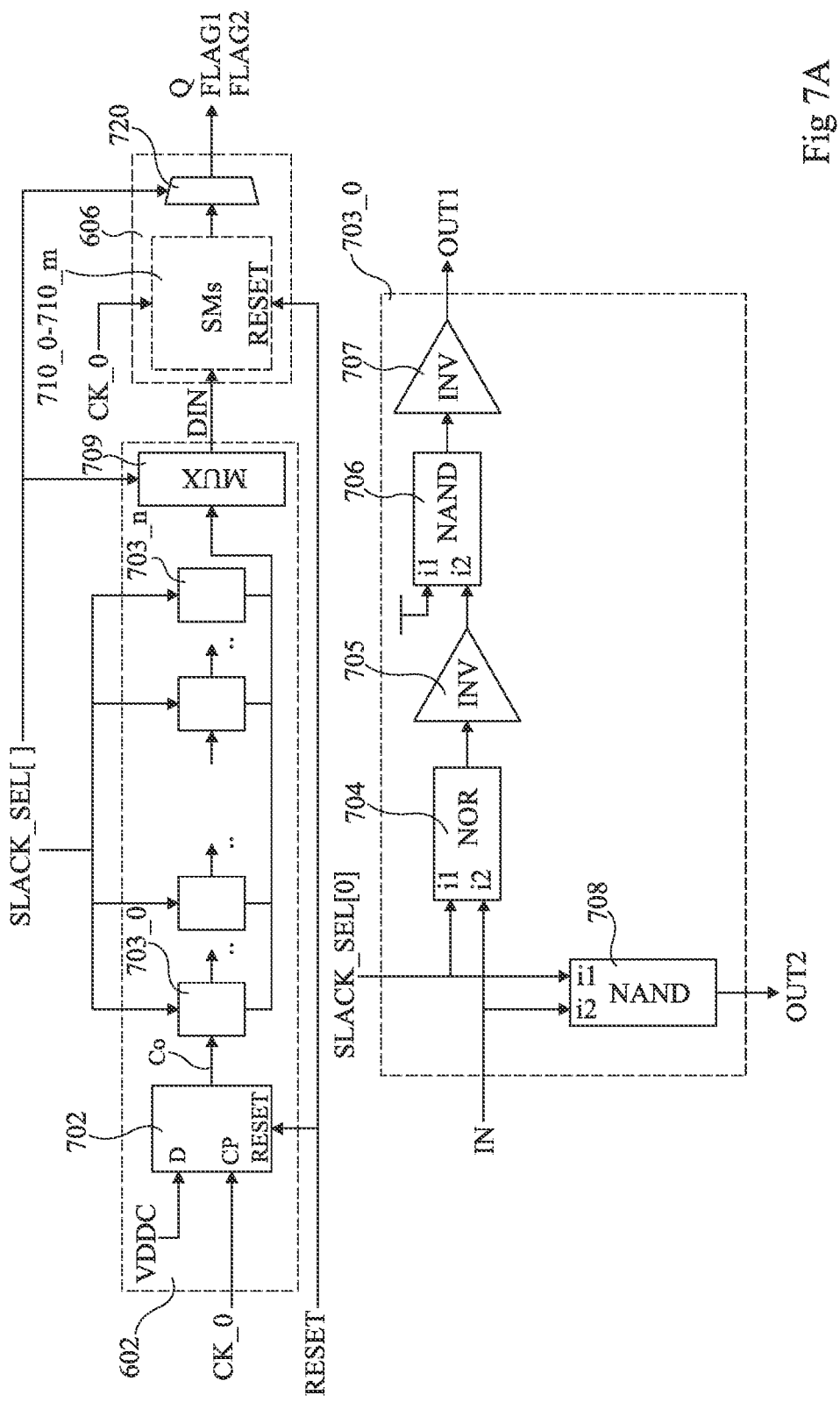
FIG. 7A schematically illustrates slack paths of the slack sensors of FIG. 6 in more detail according to an example embodiment.

FIG. 7A schematically illustrates the delay module 602 receiving the clock CK_0, and the corresponding set of slack monitors 606, of FIG. 6 in more detail according to an example embodiment. The other delay modules 602 are for example implemented by similar circuits.

The delay module 602 for example comprises a flip-flop 702 having its data input tied to the supply voltage VDDC of the island, and its clock input receiving the clock signal CK_0. This for example allows a measurement operation to be launched on a first rising edge of the clock signal CK_0. The flip-flop 702 also for example receives a reset signal RESET at its reset input, this reset signal for example being asserted in order to place the flip-flop 702 in a given state at the start of the measurement process.

The delay module 602 also for example comprises delay circuits 703_0 to 703_n, which in the example of FIG. 7A are coupled in series in order to propagate a rising edge generated by the flip-flop 702 in response to a rising edge of the clock signal CK_0. The output Co of the flip-flop 702 corresponds for example to a first rising edge of the clock signal CK_0, while the reset signal is not asserted, delayed by the delay of the flip-flop 702. The delay circuits 703_0 to 703_n together provide a delay with respect to the local clock signal CK_0 greater than or equal to that of the longest transmission path in the island. The transmission path to be monitored is selected by selector 709 based on the selection signal SLACK_SEL[ ].

The delay circuits 703_0 to 703_n are for example reference cells that are representative of the behavior of other circuits of the island, and thus provide an indication of the propagation delays that will be experienced by the actual data paths in the circuit.

For example, each of the delay circuits 703_0 to 703_n of a given delay module 602 is implemented by the same circuit, using the same transistor structural type as described above.

FIG. 7A also illustrates an example of the delay circuit 703_0, the other delay circuits for example having the same structure. In the example of FIG. 7A, the delay circuit 703_0 comprises the series connection of a NOR gate 704, an inverter (INV) 705, a NAND gate 706 having one of its inputs (i1) tied to the supply rail VDDC and its other input (i2) coupled to the output of the inverter 705, and a further inverter (INV) 707 providing an output signal OUT1 of the delay circuit 703_0. The NOR gate 704 for example receives at one of its inputs (i1) the signal SLACK_SEL[0] destined for the delay circuit 703_0, and at the other of its inputs (i2) the input signal IN of the delay circuit 703_0. For the circuit 703_0, the input signal IN is the output of the flip-flop 702, but for the other delay circuits, it is the output of the previous delay circuit. For the delay circuit 703_0 and the other delay circuits except the last circuit 703_n, the output OUT1 of the inverter 707 is for example coupled to the input of the next delay circuit in the series.

The delay circuit 703_0 also for example comprises a NAND gate 708 receiving at one of its inputs (i1) the signal SLACK_SEL[0] and at the other of its inputs (i2) the input signal IN of the delay circuit 703_0. An output OUT2 of the NAND gate 708 is for example coupled, via a selector (MUX) 709 of the delay module 602, to the slack monitors 606. In one embodiment, the selector 709 is implemented by a multiplexer. Furthermore, any combination of logic gates could be used in each delay circuit 703_0 to 703_n, depending on the desired delay of each delay circuit, and on the types of logic cells that may represent the typical circuit elements in the rest of the island.

The wells of the transistors (not illustrated in FIG. 7A) forming the logic gates of each delay circuit 703_0 to 703_n are for example biased by the voltages VNW' and VPW', as indicated above.

The selector 709 for example uses a dedicated signal among the control signals SLACK_SEL[ ] to select one or more of the outputs provided by the delay circuits 703_0 to 703_n.

In the example of FIG. 7A, the set of slack monitors 606 is formed of a plurality of slack monitor circuits (SMs) 710_0 to 710_m, each receiving a signal DIN selected by the multiplexer 709, and each generating a corresponding flag value. In some embodiments, a multiplexer 720 is for example used to select one or more of outputs of the slack monitor circuits 710_0 to 710_m to provide output flag signals of the set of slack monitors 606. For example, the multiplexer 720 is controlled by a dedicated signal among the control signals SLACK_SEL[ ]. In the example of FIG. 7A, the multiplexer 720 selects two output signals of one or more of the slack monitor circuits, the outputs being shown labelled FLAG1 and FLAG2. However, more generally the multiplexer 720 is controlled to select one or more of the output signals.

For example, in some embodiments, the selector circuit 709 is controlled to select the output signal from one of the delay circuits 703_0 to 703_n, and to provide this signal as the input signal DIN to one or more of the slack monitor circuits. Each slack monitor circuit 710_0 to 710_m for example also receives the clock signal CK_0, and is configured to detect a given slack margin.

Each flag signal for example indicates when the slack time of the given delay circuit is above or has fallen below a certain threshold. In one embodiment, the flag signal FLAG1 is asserted when the slack time is below a low threshold, implying that it is close to the setup time of synchronous devices in the circuit. The flag signal FLAG2 is for example asserted when the slack time is above a maximum desired slack.

Thus:
when the flag FLAG1 is asserted, the transistor biasing voltages should be modified to provide greater forward biasing;
when the flag FLAG2 is asserted, the transistor biasing voltages should be modified to provide less forward biasing; and
when neither of the flags FLAG1, FLAG2 is asserted, the transistor biasing voltages are for example maintained at a current level.

Of course, other coding rules for the flag generation could be used, and other voltage biasing control methods could be applied.

Each slack monitor circuit 710_0 to 710_m also for example outputs the signal Q corresponding to output signal of the corresponding delay circuit coupled from 703_0 to 703_n, clocked by the clock signal CK_0. In one embodiment, each slack monitor circuit is implemented by the SlackGuard circuit described in the French patent application filed on 24 Dec. 2018 and assigned filing number FR1874138, the contents of which is hereby incorporated by reference to the extent permitted by the law. Alternatively, another example implementation will now be described with reference to FIG. 7B.

Figure 7B:
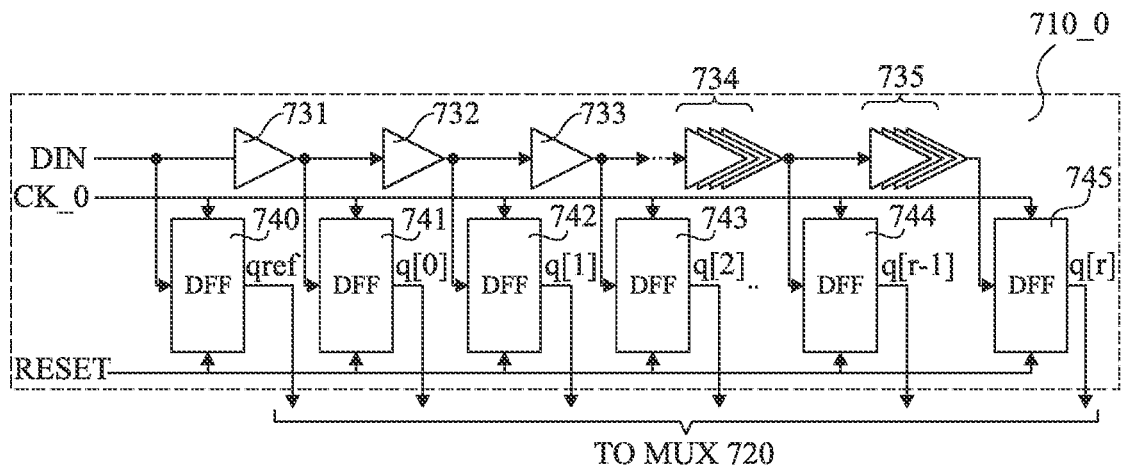
FIG. 7B schematically illustrates a slack monitor circuit of FIG. 7A in more detail according to an example embodiment.

FIG. 7B schematically illustrates the slack monitor circuit 710_0 in more detail according to an example embodiment. The other slack monitor circuits 710_1 to 710_m, if any, for example have a similar structure.

The slack monitor circuit 710_0 for example receives the signal DIN, and outputting the signal DIN to a delay line formed of the series connection of delay circuits 731 to 735. In the example of FIG. 7B, the delay circuits 731 to 735 do not introduce equal delays. For example, the circuits 731 to 733 each comprise a single delay element and the elements 734 and 735 each for example comprise the series connection of four delay elements. The delay elements of the delay circuits 731 to 735 are for example buffers, although other types of delay element could be used.

The input signal DIN, and the outputs of the delay circuits 731 to 735, are respectively coupled to an input of corresponding flip-flops 740 to 745. The flip-flops 740 to 745 are, for example, D-type flip-flops (DFF), and are for example clocked by the clock signal CK_0, and are reset by the reset signal RESET. The flip-flops 740 to 745 respectively provide output signals qref and q[0] to q[r], where r is for example equal to 4 in the case that there are five delay circuits, but could more generally be equal to 2 or more.

The outputs of the flip-flops 740 to 745 are for example provided to the multiplexer 720, which for example selects, based on the signal SLACK_SEL[ ], one or more of these outputs to provide the output flag signals.

In some embodiments, the flip-flops that are not selected by the multiplexer 720 could be deactivated. For example, this is implemented by placing a gating cell (not illustrated) at the clock input CK_0 of each flip-flop, each gating cell being controlled by the selection signal SLACK_SEL[ ] via an appropriate coupling decoding function.

With reference again to FIG. 4, in one embodiment, the control loop 408 of FIG. 4 implements the control algorithm defined by the following table:

TABLE 1

| Q | FLAG1 | FLAG2 | REACTION |
|---|---|---|---|
| Q-1 | 0 | 0 | The slack is negative (path too slow implying that Q does not change) and the control signal CP_CTRL is generated such that the transistor biasing voltage is increased with a first, relatively steep, gradient. The signal LOCK is not asserted. |
| Toggles | 0 | 1 | The slack is too long (higher than the predefined window) and the control signal CP_CTRL is generated such that the transistor biasing voltage is decreased. The signal LOCK remains asserted. |
| Toggles | 0 | 0 | Slack is in the defined window, the control signal CP_CTRL is generated such that the transistor biasing voltage is not modified, and the signal LOCK is asserted. |
| Toggles | 1 | 0 | The slack is too short ((lower than the defined window), and the control signal CP_CTRL is generated such that the transistor biasing voltage is increased, for example with a second gradient less steep than the first gradient. The signal LOCK is not asserted. |

Figure 8:
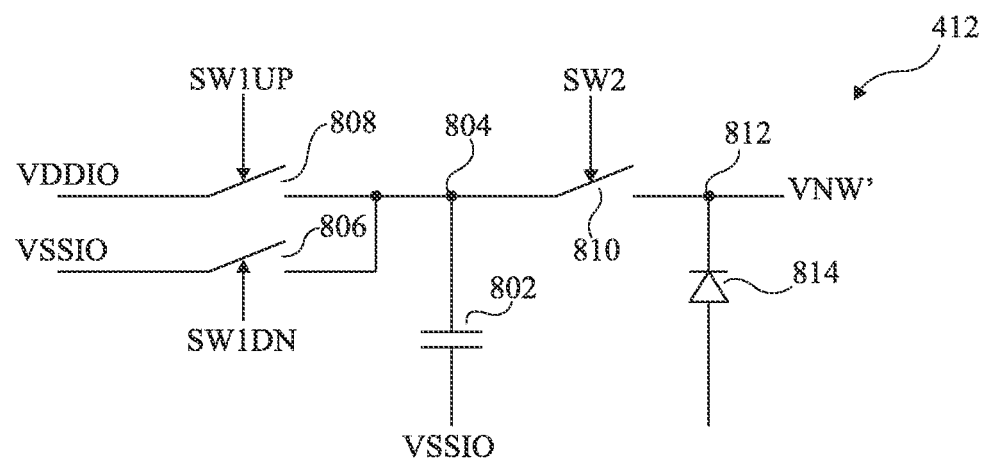
FIG. 8 schematically illustrates an n-well charge pump of the circuit of FIG. 4 in more detail according to an example embodiment.
Figure 9:
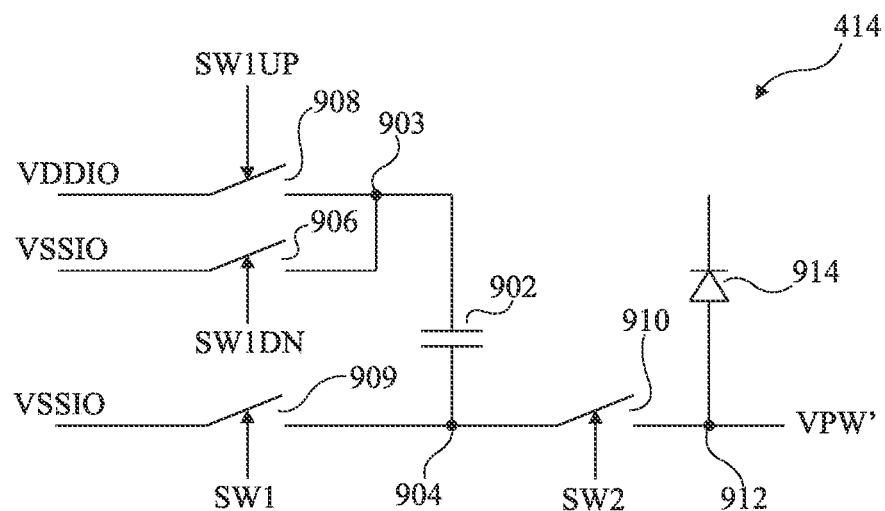
FIG. 9 schematically illustrates a p-well charge pump of the circuit of FIG. 4 in more detail according to an example embodiment.

FIGS. 8 and 9 schematically illustrate examples of the n-well and p-well charge pumps 412, 414 respectively of the circuit of FIG. 4 in more detail according to an example embodiment.

In the example of FIG. 8, the n-well charge pump 412 comprises a capacitor 802 coupled between a VSSIO rail and a node 804, a switch 806 coupling the node 804 to the VSSIO rail, a switch 808 coupling the node 804 to the VDDIO rail, and a switch 810 coupling the node 804 to the output 812 of the charge pump 412. The capacitor 802 and the switches are for example sized according to the capacitance and leakage of the NWELL, this capacitance and leakage being represented in FIG. 8 by a diode 814. The rails VDDIO and VSSIO could be replaced by rails VDDC and VSSC.

The switches 806, 808 and 810 are for example respectively controlled by control signals SW1DN, SW1UP and SW2.

In the example of FIG. 9, the p-well charge pump 414 for example comprises a capacitor 902 coupled between nodes 903 and 904, the node 903 being coupled to the VSSIO rail via a switch 906 and to the VDDIO rail via a switch 908, and the node 904 being coupled to the VSSIO rail via a switch 909, and to the output 912 of the charge pump 414 via a switch 910. The capacitor 902 and the switches are for example sized according to the capacitance and leakage of the PWELL, this capacitance and leakage being represented by a diode 914.

The switches 906, 908, 909 and 910 are for example respectively controlled by control signals SW1DN, SW1UP, SW1 and SW2.

In one embodiment, the capacitors 802 and 902 of FIGS. 8 and 9 have capacitances equal to around 1/300th of the capacitance of the corresponding well. This ratio is for example chosen as a function of the well leakage, the maximum operating temperature (the higher the temperature, the higher the leakage, and the higher the capacitance value should be), the switching frequency (the higher the switching frequency, the lower the capacitor value should be), and also as a function of the maximum voltage to be supplied (the closer the absolute value of the maximum well voltage is to the voltage VDDIO, the high the capacitance value should be). The ratio can also be decided as a function of a targeted settling time of the well voltage, and of the available surface area. For example, assuming a well capacitance of around 0.3 nF, the capacitors 802, 902 for example have capacitances of around 1 pF.

In operation, the charge pump control circuit 410 for example controls the switches of the charge pumps 412, 414 using three-phase cycles, the first phase PHASE1 being to load the capacitor 802/902, the second phase PHASE2 being to transfer the charge from the capacitor 802/902 to the corresponding well, and the third phase PHASE3 being an idle phase between switching. For example, the switching frequency is in the range 1 to 50 MHz. In one embodiment, the switches are controlled to increase the absolute value of the corresponding biasing voltage (CP-NW UP, CP-PW UP), decrease the absolute value of the corresponding biasing voltage (CP-NW DN, CP-PW DN), or maintain the current level (SKIP), by asserting (ON) and deactivating (OFF) the signals during the three phases as defined in the following table:

TABLE 2

| Operation | Signal | PHASE1 | PHASE2 | PHASE3 |
|---|---|---|---|---|
| CP-NW UP | SW1UP | ON | OFF | OFF |
| | SW1DN | OFF | OFF | ON |
| | SW2 | OFF | ON | OFF |
| CP-NW DN | SW1UP | OFF | OFF | OFF |
| | SW1DN | ON | OFF | ON |
| | SW2 | OFF | ON | OFF |
| CP-NW SKIP | SW1UP | OFF | OFF | OFF |
| | SW1DN | ON | ON | ON |
| | SW2 | OFF | OFF | OFF |
| CP-PW UP | SW1UP | ON | OFF | OFF |
| | SW1DN | OFF | ON | ON |
| | SW1 | ON | OFF | ON |
| | SW2 | OFF | ON | OFF |

TABLE 2-continued

| Operation | Signal | PHASE1 | PHASE2 | PHASE3 |
|---|---|---|---|---|
| CP-PW DN | SW1UP | OFF | OFF | OFF |
| | SW1DN | ON | ON | ON |
| | SW1 | ON | OFF | ON |
| | SW2 | OFF | ON | OFF |
| CP-PW SKIP | SW1UP | OFF | OFF | OFF |
| | SW1DN | ON | ON | ON |
| | SW1 | ON | ON | ON |
| | SW2 | OFF | OFF | OFF |

In one embodiment, the asymmetry sensor 416 of FIG. 4, when activated, is also configured to modify the control of the switches in the charge pumps 412, 414. For example, operations UP, DN and SKIP for each of the charge pumps are controlled as defined in the following table, in which NW LOW implies that the n-well biasing voltage is low with respect to the p-well biasing voltage and should be increased, and PW LOW implies that the p-well biasing voltage is low with respect to the n-well biasing voltage and should be increased:

TABLE 3

| MAIN LOOP | | ASSYN LOOP | | | |
|---|---|---|---|---|---|
| | | NW | PW | CP-NW | CP-PW |
| UP | DN | LOW | LOW | OPERATION | |
| 0 | 0 | 0 | 0 | SKIP | SKIP |
| 0 | 0 | 0 | 1 | SKIP | UP |
| 0 | 0 | 1 | 0 | UP | SKIP |
| 0 | 1 | 0 | 0 | DN | DN |
| 0 | 1 | 0 | 1 | DN | SKIP |
| 0 | 1 | 1 | 0 | SKIP | DN |
| 1 | 0 | 0 | 0 | UP | UP |
| 1 | 0 | 0 | 1 | SKIP | UP |
| 1 | 0 | 1 | 0 | UP | SKIP |
| 1 | 1 | X | X | SKIP | SKIP |
| X | X | 1 | 1 | SKIP | SKIP |

The last two rows of the table correspond to illegal controls, which for example result in skip operations.

Figure 10:
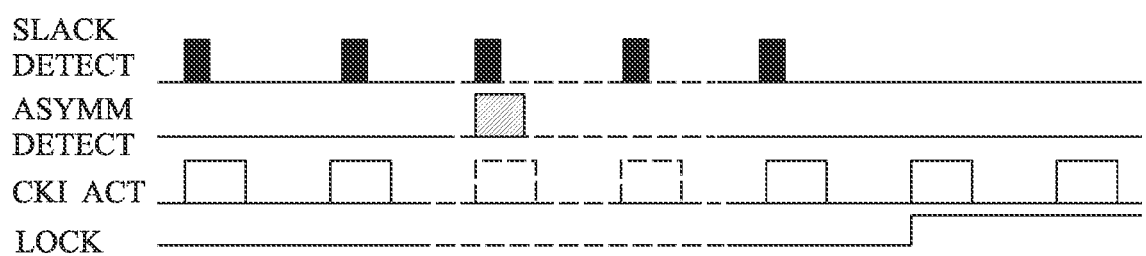
FIG. 10 is a timing diagram representing operation of the adaptive body biasing circuit of FIG. 4 according to an example embodiment.

FIG. 10 is a timing diagram representing operation of the adaptive body biasing circuit of FIG. 4 according to an example embodiment. In particular, FIG. 10 represents an example of periods in which slack detection (SLACK DETECT.) is activated, periods in which asymmetry detection (ASYMM DETECT.) is activated, periods in which the frequency of the internal clock CK_I is changed (CK_I ACT.), and the lock signal LOCK. Changing the frequency of CK_I is optional, but for example allows a saving in power consumption.

The slack detection is for example performed with either a regular or a variable wait time, and, during each slack detection period, the frequency of the internal clock CK_I is also increased. The asymmetry detection is for example performed once for every M activations of the slack detection, where M is for example equal to at least one, and is equal to three in the example of FIG. 10.

Figure 11:
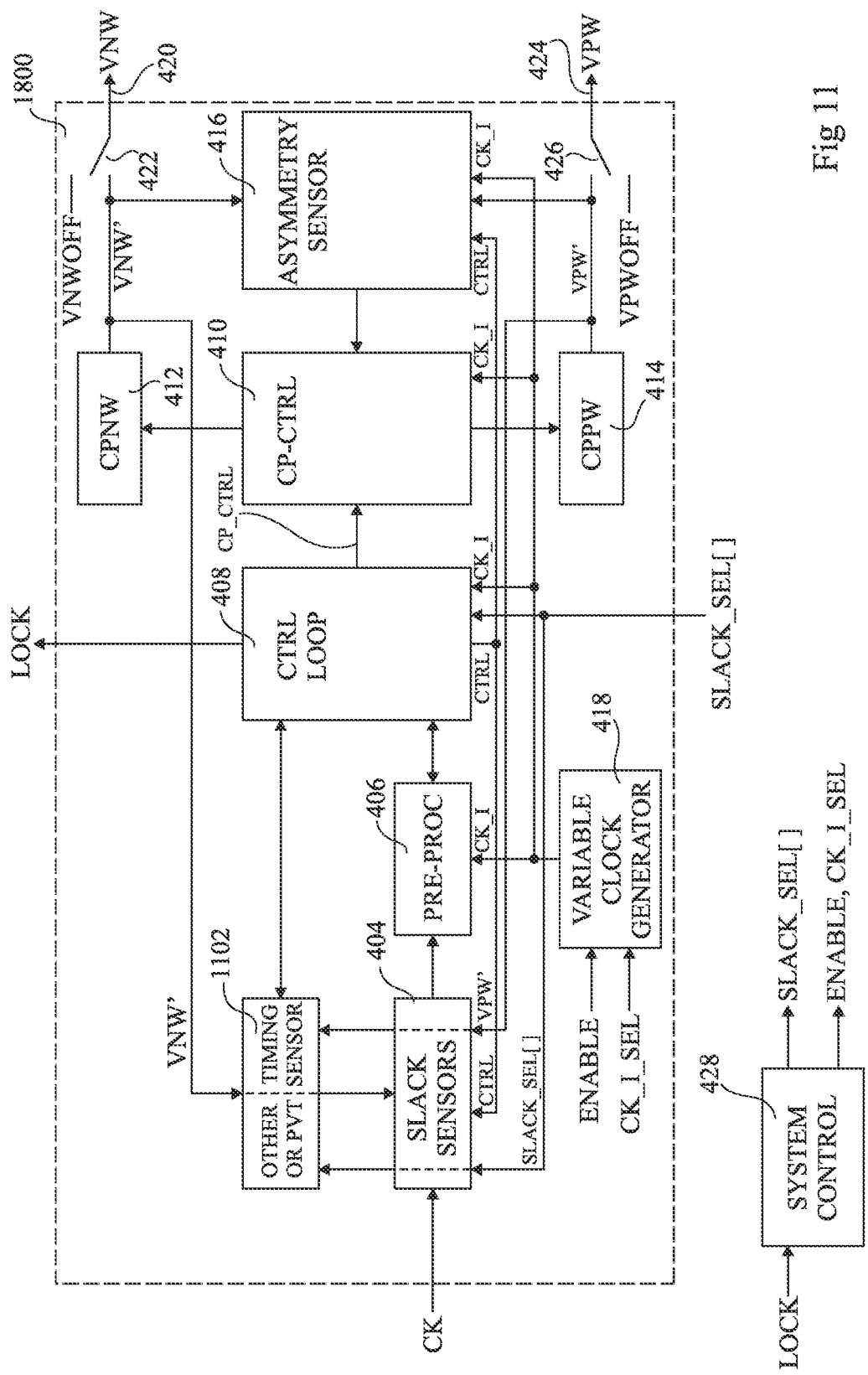
FIG. 11 schematically illustrates a circuit for adaptive body biasing according to a further example embodiment of the present disclosure.

FIG. 11 schematically illustrates a circuit 1100 for adaptive body biasing according to an alternative embodiment of that of FIG. 4. The circuit 1100 of FIG. 11 has many features in common with the circuit 400 of FIG. 4, and these features are labelled with like reference numerals in FIG. 11, and will not be described again in detail.

With respect to the circuit 400, the circuit 1100 additionally comprises a further timing or PVT sensor (OTHER TIMING OR PVT SENSOR) 1102, which for example is a known type of timing or PVT sensor such as one based on a ring oscillator or the like. The sensor 1102 is for example configured to detect variations in process, voltage and/or temperature, where the voltage is for example the biasing voltages VNW', VPW'. Indeed, the sensor 1102 for example receives the voltages VNW' and VPW', and is coupled to the control loop 408. The sensor 1102 also for example receives a supply voltage VDD and ground voltage. In some embodiments, the sensor 1102 may also receive one or more of the control signals SLACK_SEL[ ].

The sensor 1102 is for example configured to interact with the control loop 408 to adjust the voltages VNW and VPW. In this embodiment, the slack sensors 404 provide additional, complementary information to the control loop 408 for controlling the operation of the loop, such as to adjust its operation, for example by adjusting internal coefficients used to control the feedback loop, to provide a more accurate sensing of the appropriate body bias voltage range of the island 302, 304.

Figure 12:
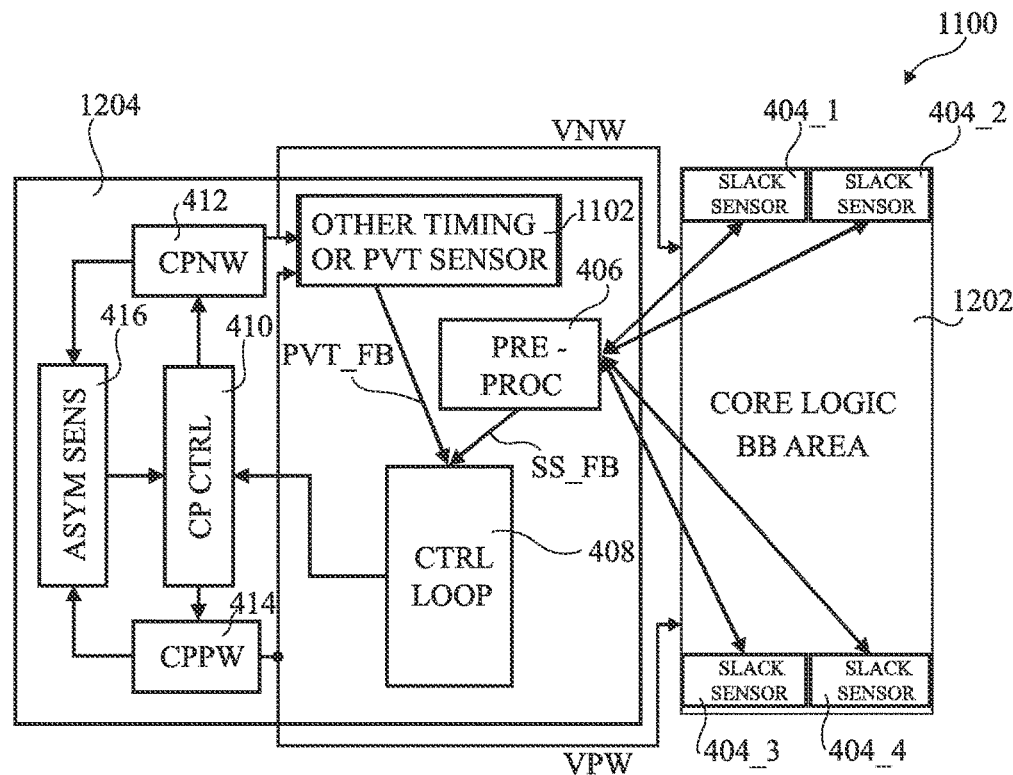
FIG. 12 schematically illustrates the circuit of FIG. 11 in more detail according to an example embodiment of the present disclosure.

FIG. 12 schematically illustrates the circuit 1100 of FIG. 11 in more detail according to an example embodiment of the present disclosure.

The slack sensors 404 are for example distributed within a core logic body biasing area (CORE LOGIC BB AREA) 1202 of the circuit region, corresponding for example to one of the islands 302, 304 of FIG. 3, to which body biasing is for example to be applied. For example, the area 1202 receives the NWELL and PWELL biasing voltages VNW, VPW from the circuits 412 and 414 respectively. In the example of FIG. 12, the slack sensors 404 comprise four slack sensors (SLACK SENSOR) 404_1 to 404_4. Each of these slack sensors 404_1 to 404_4 for example comprises a corresponding on-chip clock controller 604, delay module 602, and set of one or more slack monitors 606, as described in relation with FIG. 6. The slack sensors 404_1 to 404_4 for example detect local variations affecting the circuit region being monitored.

The pre-processing circuit (PRE-PROC) 406 is for example configured to receive the output flags of each of the slack sensors 404, and merges these flags to generate a combined feedback signal SS_FB that is provided to the control loop 408. For example, the combined feedback signal SS_FB comprises, in some embodiments, an UP flag indicating when the magnitude of the biasing voltages VNW, VPW should be increased based on the outputs of one or more of the slack sensors, and a DOWN flag indicating when the magnitude of the biasing voltages VNW, VPW can be decreased based on the outputs of one or more of the slack sensors.

The control loop 408 also receives a feedback signal PVT_FB from the sensor 1102, indicating when the magnitude of the biasing voltages VNW, VPW should be increased or decreased. The control loop 408 is for example configured to adjust the feedback signal PVT_FB based on the slack sensor feedback signal SS_FB, such that, in the case that there are local constraints to be respected, the biasing voltages can be adjusted accordingly.

FIG. 13 schematically illustrates the circuit 1100 of FIG. 11 in yet more detail according to an example embodiment of the present disclosure. In the example of FIG. 13, the other timing or PVT sensor 1102 is a sensor that generates the feedback signal PVT_FB in the form of an oscillating signal at a frequency that is a function of the operating speed of PMOS and NMOS transistors in the circuit. For example, the sensor 1102 is ring oscillator or the like. This sensor 1102 is for example used to provide a coarse adjustment to the body biasing voltage VNW and/or VPW using on a control loop based on the generated frequency. The slack sensors 404 are for example configured to provide a fine adjustment to the body biasing voltage VNW and/or VPW by modifying the gain of the control loop.

For example, the control loop 408 comprises, in the example of FIG. 13, a frequency divider (DIV R) 1302, a frequency divider (DIV M) 1304, a counter N (COUNTER N) 1306 and a frequency-based control circuit 1308.

The frequency divider 1302 for example receives the clock signal CK, which is for example the same clock signal as the one that is provided to the slack sensors 404, and divides its frequency by R, where R is for example an integer equal to at least one, in order to generate a reference frequency signal FREQ_REF. In some embodiments, the frequency divider 1302 is implemented by a counter.

The frequency divider 1304 for example receives the output signal PVT_FB of the sensor 1102, and divides its frequency by M, where M is for example an integer equal to at least one, in order to generate a detection signal FREQ_DET. In some embodiments, the frequency divider 1304 is implemented by a counter. The signal FREQ_DET is provided to the counter N 1306, which for example performs a further frequency division by a factor N in order to generate an output signal FREQ_DET', where N is for example an integer of at least 8 and for example of at least 100 in some examples. Typically, N is set to an initial or default value, equal for example to 200, and can be adjusted for example to values of around −50%, and +100%, of the initial or default value, for example to between 100 and 400. The value N is for example the count limit of the counter 1306, wherein the counter resets each time the count limit is reached. The counter 1306 is for example configured to generate an output edge or pulse each time the count value of the counter reaches N. The value of N is for example adjusted based on the feedback signal SS_FB from the slack sensors.

The frequency signals FREQ_REF and FREQ_DET' are for example provided to the frequency-based control circuit 1308, which is for example configured to control the body biasing voltage VNW and/or VPW based on a frequency comparison of the signals FREQ_REF and FREQ_DET'. For example, the circuit 1308 comprises a frequency comparator configured to compare the frequencies of the signals FREQ_REF and FREQ_DET', and to adjust the body biasing voltage VNW and/or VPW such that the frequencies are equal.

The division factors R and M of the frequency dividers 1302 and 1304, and a default value of N, are for example chosen such that the frequencies of the signals FREQ_REF and FREQ_DET' are equal when the speed of the NMOS and PMOS transistors in the circuit are within an acceptable range. The adjustment of the count value N allows for a fine adjustment to be made in view of local variations in the transistor speeds detected by the slack sensors 404. For example, if a flag is raised by one or more of the slack sensors 404 indicating that the delay is too high, the value of N is for example incremented in order to increase the frequency of the signal FREQ_DET and keeping FREQ_DET' unchanged and thereby adjust the gain of the loop.

Figure 14:
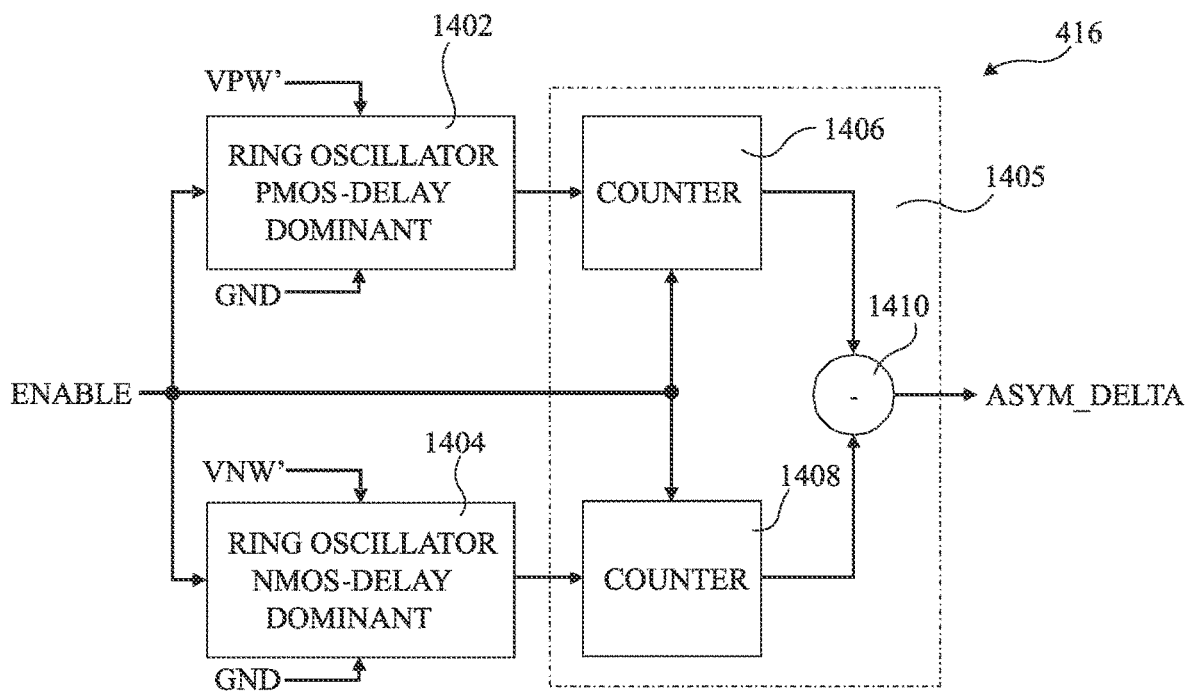
FIG. 14 schematically illustrates an asymmetry sensor of FIGS. 4, 11, 12 and 13 in more detail according to an example embodiment of the present disclosure.

FIG. 14 schematically illustrates the asymmetry sensor 416 of FIGS. 4, 11, 12 and 13 in more detail according to an example embodiment of the present disclosure. In the example of FIG. 14, the asymmetry sensor 416 comprises a ring oscillator (RING OSCILLATOR PMOS-DELAY DOMINANT) 1402 that generates an oscillating output signal having a frequency that is more dependent on PMOS transistor delays than NMOS transistor delays, and a ring oscillator (RING OSCILLATOR NMOS-DELAY DOMINANT) 1404 that generates an oscillating output signal having a frequency that is more dependent on NMOS transistor delays than PMOS transistor delays. In some embodiments, the oscillator 1402 comprises only PMOS transistors and no NMOS transistors, and the oscillator 1404 comprises only NMOS transistors and no PMOS transistors. The transistors of the ring oscillator 1402 for example receive the body biasing voltage VPW', and the transistors of the ring oscillator 1404 for example receive the body biasing voltage VNW'. The ring oscillators 1402, 1404 are for example enabled by an enable signal ENABLE. The outputs of the ring oscillators 1402, 1404 are for example provided to a phase frequency detector 1405, which for example comprises counters 1406, 1408 respectively configured to count periods of the output signals of the ring oscillators 1402, 1404, and a comparator 1410 configured to compare the count values in order to generate an output signal ASYM_DELTA representing for example the amount of frequency difference between the ring oscillators. This output signal ASYM_DELTA is for example provided to the charge pump control circuit 410 in order to cause the balance between the biasing voltages VNW and VPW to be adjusted accordingly.

Figure 15:
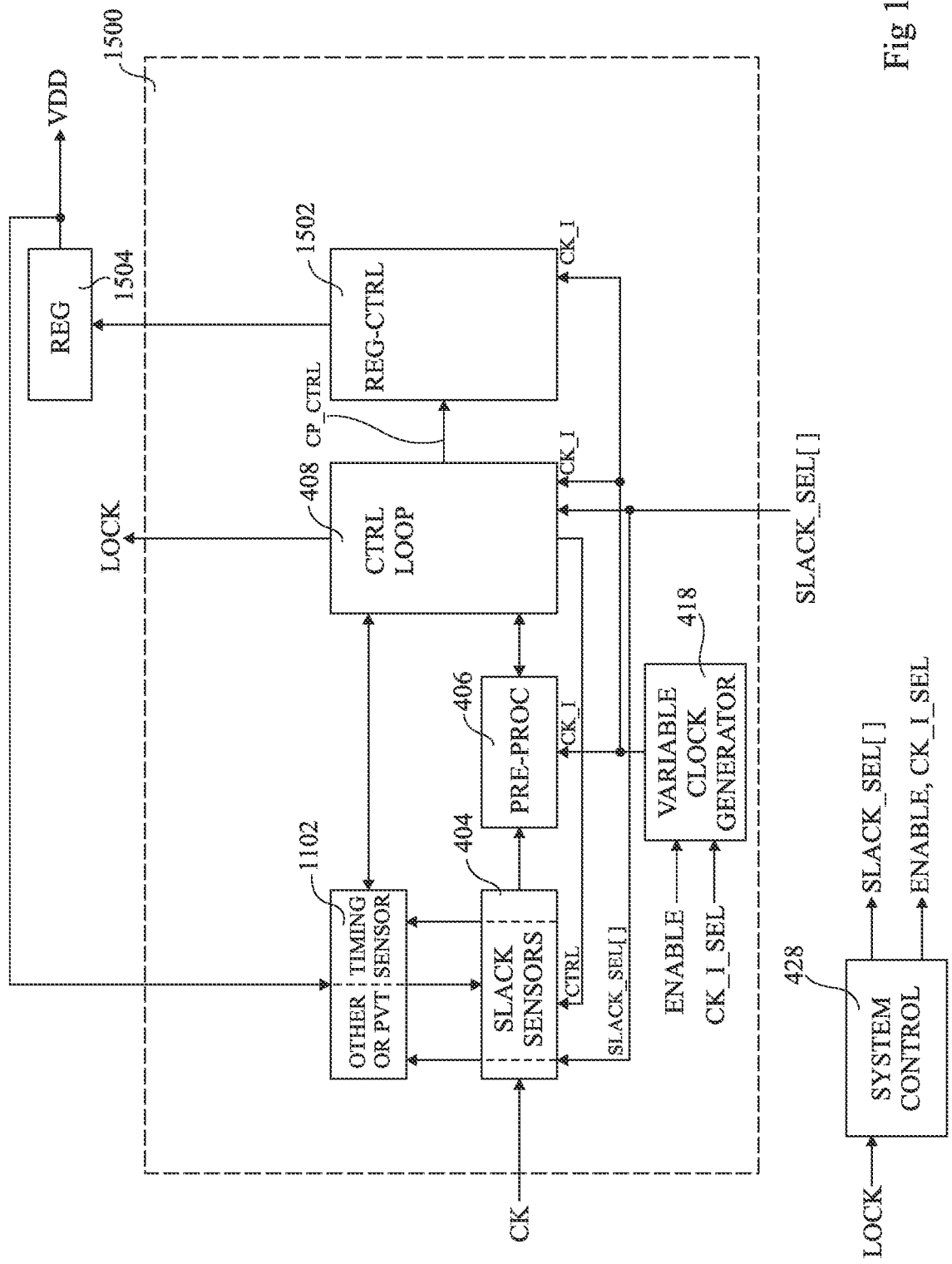
FIG. 15 schematically illustrates a circuit for adaptive supply voltage regulation according to a further example embodiment of the present disclosure.

FIG. 15 schematically illustrates a circuit 1500 for adaptive supply voltage regulation. The circuit 1500 is similar to the circuit 1100 of FIG. 11, but rather than generating body biasing voltages, the circuit 1500 is used to control the level of a supply voltage VDD of the circuit region. Thus, rather than the charge-pump control circuit 410, the circuit 1500 comprises a voltage regulator control circuit 1502 configured to control a voltage regulator (REG) 1504, which is configured to supply a voltage VDD to the circuit region. In such a case, the circuits 412, 414 and 416 of FIG. 4 can be removed. Furthermore, the supply voltage VDD, rather than the body biasing voltage, is supplied in a feedback path to the slack sensors 404 to power the transistors of the delay lines, which are for example biased by other means. Furthermore, the circuit 1500 comprises the other timing or PVT sensor 1102, which is also supplied by the supply voltage VDD, and is for example sensitive to variations in the supply voltage VDD. It will be apparent to those skilled in the art how each of the embodiments described herein could be adapted to control the supply voltage VDD, rather than the body biasing voltage of the circuit region.

An advantage of the embodiments described herein is that, by providing slack sensors comprising delay circuits and means for selecting the propagation delay used during the slack detection, a same voltage regulation or adaptive body biasing circuit can be tuned for a given circuit region, based for example on the length of one or more critical timing paths of the circuit region. Other embodiments described herein also for example permit a same voltage regulation or adaptive body biasing circuit, having a range of settings, and in particular a range of different slack sensors, to provide a supply voltage and/or adaptive body biasing for a plurality of circuit islands of a same chip and/or of different chips.

Furthermore, an advantage of providing a control loop based another frequency-based PVT sensor, and using the slack sensor detection signals to adjust the gain of the control loop, is that it is possible to take into account not only general PVT conditions in the circuit, but also local variations detected by the slack sensors. Indeed, frequency-based PVT sensors, such as ring oscillators, generate frequency signals that vary as a function of variations in at least one of the PVT conditions. To detect local variations, multiple PVT sensors could be distributed through the circuit to be monitored. However, it is technically challenging to take into account multiple frequencies generated by multiple PVT sensors in a single control loop. By providing slack sensors for detecting the local variations, and using the slack sensor outputs to adjust the gain of the frequency control loop, it is possible to provide a single frequency control loop that can take into account local variations.

Various embodiments and variants have been described. Those skilled in the art will understand that certain features of these embodiments can be combined and other variants will readily occur to those skilled in the art. For example, while embodiments have been described based on certain transistor structural types, it will be apparent to those skilled in the art that the principles described herein could be applied to transistors having any type of structure permitting body biasing voltages to be applied.

It will also be apparent to those skilled in the art that a different clock frequency could be applied to the divider 1302 and to the slack sensors 404 of FIG. 13, and also different clock frequencies could be applied to the slack sensors 404_1, 404_2, 404_3, 404_4 in order to consider various different natures of gates involved in different clock domains of a design with multiple clocks.

The invention claimed is:

1. An adaptive body biasing or voltage regulation circuit for a circuit region, comprising:
 a first delay module having a plurality of delay circuits configured to delay at least one edge of a local clock signal of the circuit region, a first of the delay circuits providing a first output signal delayed by a first delay with respect to the local clock signal, and a second of the delay circuits providing a second output signal delayed by a second delay with respect to the local clock signal;
 a multiplexer configured to select one of the first and second output signals;
 a first slack monitor circuit configured to generate a first detection signal indicating when a slack time of the selected one of the first and second output signals is less than a first threshold;
 a voltage generation circuit configured to generate at least one supply voltage for the circuit region, or at least one biasing voltage for biasing wells of transistors in the circuit region, using a further control loop comprising a process, voltage and/or temperature sensor; and
 a control circuit configured to adjust a gain of the further control loop based on the first detection signal.

2. The circuit of claim 1, wherein the process, voltage and/or temperature sensor is configured to generate an oscillating output signal having a frequency that varies as a function of process, voltage and/or temperature variations, and wherein the control circuit is configured to adjust the gain by modifying a division value of a frequency divider configured to divide the frequency of the oscillating output signal in order to generate a modified oscillating output signal.

3. The circuit of claim 2, wherein the frequency divider is a counter, and the division value is set by a count limit of the counter.

4. The circuit of claim 2, wherein the voltage generate circuit further comprises a frequency-based control circuit configured to compare the frequency of the modified oscillating output signal with the frequency of a reference clock signal, and to generate the at least one supply voltage for the circuit region, or the at least one biasing voltage, based on the comparison.

5. The circuit of claim 1, wherein the first slack monitor, or a second slack monitor, is configured to generate a second detection signal indicating when a slack time of the selected one of the first and second output signals is greater than a further threshold, wherein the biasing circuit is configured to generate the at least one biasing voltage based on the first and second detection signals.

6. The circuit of claim 1, wherein the plurality of delay circuits are coupled in series with each other to delay the propagation of at least one edge of the local clock signal.

7. The circuit of claim 1, wherein each delay circuit comprises one or more logic elements formed of transistors having wells biased by the at least one biasing voltage.

8. The circuit of claim 1, wherein the biasing circuit is configured to generate a first biasing voltage for biasing n-type wells of transistors of a first conduction type in the circuit region, and a second biasing voltage for biasing p-type wells of transistors of a second conduction type in the circuit region.

9. The circuit of claim 8, further comprising a first voltage generator configured to generate the first biasing voltage and a second voltage generator configured to generate the second biasing voltage.

10. The circuit of claim 9, wherein the first and/or second voltage generators are charge pumps.

11. The circuit of claim 8, further comprising an asymmetry sensor configured to detect when the first and second biasing voltages result in asymmetry between the n-well and p-well biasing, wherein the biasing circuit is configured to generate the at least one biasing voltage based on the asymmetry detection.

12. The circuit of claim 1, wherein the delay circuits of the first delay module each comprise one or more logic elements formed of transistors of a first structural type having threshold voltages falling in a first range, the adaptive body biasing circuit further comprising:
a second delay module having a plurality of delay circuits configured to delay the at least one edge of the local clock signal of the circuit region, wherein the delay circuits of the second delay module each comprise one or more logic elements of a different type to those forming the first delay module, the one or more logic elements of the second delay module being formed of transistors of the first structural type.

13. The circuit of claim 12, further comprising:
a third delay module having a plurality of delay circuits configured to delay the at least one edge of the local clock signal of the circuit region, wherein the delay circuits of the third delay module each comprise one or more logic elements formed of transistors of a second structural type having threshold voltages falling in a second range.

14. The circuit of claim 13, wherein the first slack monitor is implemented by transistors of the first structural type, and the circuit further comprises a second slack monitor circuit implemented by transistors of the second structural type.

15. The circuit of claim 1, further comprising a system control circuit configured to generate a selection signal for performing the selection of one of the first and second detection signals.

16. The circuit of claim 1, further comprising a further control loop comprising a timing, process, voltage and/or temperature sensor (1102), the biasing circuit (410, 412, 414) being configured to generate the at least one biasing voltage (VNW, VPW) further based on the further control loop.

17. An integrated circuit comprising:
a first circuit region receiving a first local clock signal;
a second circuit region receiving a second local clock signal; and
the adaptive body biasing or voltage regulation circuit according to claim 1, wherein the plurality of delay circuits of the first delay module are configured to delay at least one edge of the first local clock signal, or of a clock signal generated based on the first local clock signal, the adaptive body biasing or voltage regulation circuit further comprising a further delay module comprising a further plurality of delay circuits configured to delay at least one edge of the second local clock signal, or of a clock signal generated based on the second local clock signal, to generate one or more further output signals, and a further slack monitor circuit configured to generate a further detection signal indicating when a slack time of a selected one of the further output signals is less than a first threshold, wherein the control circuit is configured to adjust the gain of the further control loop based also on the further detection signal.

18. A method of adaptive body biasing of transistors in a circuit region of an integrated circuit, the method comprising:
delaying, by a first delay module having a plurality of delay circuits, at least one edge of a local clock signal of the circuit region, wherein a first of the delay circuits provides a first output signal delayed by a first delay with respect to the local clock signal, and a second of the delay circuits provides a second output signal delayed by a second delay with respect to the local clock signal;
selecting one of the first and second output signals;
generating, by a first slack monitor, a first detection signal indicating when a slack time of the selected one of the first and second output clock signals is less than a first threshold; and
generating, by a voltage generation circuit, at least one supply voltage for the circuit region, or at least one biasing voltage for biasing wells of transistors in the circuit region, based on the first detection signal using a further control loop comprising a process, voltage and/or temperature sensor, wherein a gain of the further control loop is adjusted based on the first detection signal.

19. An adaptive body biasing circuit for a circuit region, comprising:
a first delay module having a plurality of delay circuits configured to delay at least one edge of a local clock signal of the circuit region, a first of the delay circuits providing a first output signal delayed by a first delay with respect to the local clock signal, and a second of the delay circuits providing a second output signal delayed by a second delay with respect to the local clock signal;
a multiplexer configured to select one of the first and second output signals;
a first slack monitor circuit configured to generate a first detection signal indicating when a slack time of the selected one of the first and second output signals is less than a first threshold;
a voltage generation circuit configured to generate, based on the first detection signal, a first biasing voltage for biasing n-type wells of transistors of a first conductivity type in the circuit region, and a second biasing voltage for biasing p-type wells of transistors of a second conductivity type in the circuit region; and a control circuit configured to adjust a gain of the further control loop based on the first detection signal.

20. A method of adaptive body biasing of transistors in a circuit region of an integrated circuit, the method comprising:
- delaying, by a first delay module having a plurality of delay circuits, at least one edge of a local clock signal of the circuit region, wherein a first of the delay circuits provides a first output signal delayed by a first delay with respect to the local clock signal, and a second of the delay circuits provides a second output signal delayed by a second delay with respect to the local clock signal;
- selecting one of the first and second output signals;
- generating, by a first slack monitor, a first detection signal indicating when a slack time of the selected one of the first and second output clock signals is less than a first threshold;
- generating, by a biasing circuit based on the first detection signal, a first biasing voltage for biasing n-type wells of transistors of a first conductivity type in the circuit region, and a second biasing voltage for biasing n-type wells of transistors of a first conductivity type in the circuit region; and
- detecting, by an asymmetry sensor, when the first and second biasing voltages result in asymmetry between the n-type well and p-type well biasing, wherein the biasing circuit is configured to generate the first and second biasing voltages based on the asymmetry detection.

21. An integrated circuit comprising:
- a first circuit region receiving a first local clock signal;
- a second circuit region receiving a second local clock signal; and
- an adaptive body biasing or voltage regulation circuit comprising:
  - a first delay module having a plurality of delay circuits configured to delay at least one edge of the first local clock signal or of a clock signal generated based on the first local clock signal, a first of the delay circuits providing a first output signal delayed by a first delay with respect to the first local clock signal, and a second of the delay circuits providing a second output signal delayed by a second delay with respect to the first local clock signal;
  - a multiplexer configured to select one of the first and second output signals;
  - a first slack monitor circuit configured to generate a first detection signal indicating when a slack time of the selected one of the first and second output signals is less than a first threshold;
  - a control loop configured to provide one or more control signals based the first detection signal;
  - a voltage generation circuit configured to generate at least one supply voltage for the circuit region, or at least one biasing voltage for biasing wells of transistors in the first and second circuit regions based on the one or more control signals, the adaptive body biasing circuit or voltage regulation circuit further comprising:
    - a second delay module having a further plurality of delay circuits configured to delay at least one edge the second local clock signal or of a clock signal generated based on the second local clock signal, in order to generate one or more output signals; and
    - a further slack monitor circuit configured to generate a further detection signal indicating when a slack time of a signal selected among the one or more output signals is less than the first threshold.

22. A method of voltage regulation or of adaptive body biasing of transistors in a circuit region of an integrated circuit comprising a first circuit region receiving a first local clock signal; a second circuit region receiving a second local clock signal; and an adaptive body biasing circuit, the method comprising:
- delaying, by a first delay module having a plurality of delay circuits, at least one edge of the first local clock signal or of a clock signal generated based on the first local clock signal, wherein a first of the delay circuits provides a first output signal delayed by a first delay with respect to the first local clock signal, and a second of the delay circuits provides a second output signal delayed by a second delay with respect to the first local clock signal;
- selecting one of the first and second output signals;
- generating, by a first slack monitor, a first detection signal indicating when a slack time of the selected one of the first and second output clock signals is less than a first threshold;
- providing, by a control loop, one or more control signals based the first detection signal;
- generating, by a voltage generation circuit, at least one supply voltage for the circuit region, or at least one biasing voltage for biasing wells of transistors in the first and second circuit regions, based on the one or more control signals;
- delaying, by a second delay module having a plurality of delay circuits, at least one edge of the second local clock signal or of a clock signal generated based on the second local clock signal, in order to generate one or more output signals; and
- generating, by a further slack monitor, a further detection signal indicating when a slack time of a signal selected among the one or more output signals is less than the first threshold.

* * * * *